(12) United States Patent
Lee et al.

(10) Patent No.: US 10,477,660 B2
(45) Date of Patent: Nov. 12, 2019

(54) COMPLEX ELECTRONIC COMPONENT AND METHOD FOR MANUFACTURING THE SAME

(71) Applicant: SAMSUNG ELECTRO-MECHANICS CO., LTD., Suwon-si, Gyeonggi-do (KR)

(72) Inventors: Sang Moon Lee, Suwon-si (KR); Sung Jin Park, Suwon-si (KR); Ha Yoon Song, Suwon-si (KR); Sung Ryong Ma, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 96 days.

(21) Appl. No.: 15/467,273

(22) Filed: Mar. 23, 2017

(65) Prior Publication Data

US 2017/0374727 A1 Dec. 28, 2017

(30) Foreign Application Priority Data

Jun. 24, 2016 (KR) .................. 10-2016-0079554

(51) Int. Cl.
*H01F 27/28* (2006.01)
*H05F 3/04* (2006.01)
(Continued)

(52) U.S. Cl.
CPC ........... *H05F 3/04* (2013.01); *H01F 17/0013* (2013.01); *H01F 27/2804* (2013.01);
(Continued)

(58) Field of Classification Search
CPC ...... H01F 27/34; H01F 41/02; H01F 27/2804; H01F 2027/2809
(Continued)

(56) References Cited

U.S. PATENT DOCUMENTS

2005/0085393 A1* 4/2005 Nakao .................. G01L 1/2287
505/100
2011/0222203 A1 9/2011 Adachi et al.
(Continued)

FOREIGN PATENT DOCUMENTS

EP 2768093 A1 8/2014
JP 2010-109311 A 5/2010
(Continued)

OTHER PUBLICATIONS

Office Action issued in corresponding Japanese Patent Application No. 2017-060993, dated Feb. 6, 2018.
(Continued)

*Primary Examiner* — Tszfung J Chan
(74) *Attorney, Agent, or Firm* — Morgan, Lewis & Bockius LLP

(57) ABSTRACT

A complex electronic component includes: an element part and an electrostatic discharge (ESD) protection part disposed on the element part. The ESD protection part includes: first and second discharging electrodes having a gap disposed therebetween; a blocking layer disposed between the first and second discharging electrodes; and a discharging layer which is disposed to cover an upper portion of the blocking layer and is in contact with top surfaces of the first and second discharging electrodes.

7 Claims, 4 Drawing Sheets

(51) Int. Cl.
  *H01F 27/34* (2006.01)
  *H01F 41/02* (2006.01)
  *H03H 1/00* (2006.01)
  *H03H 3/00* (2006.01)
  *H01F 17/00* (2006.01)

(52) U.S. Cl.
  CPC ............. *H01F 27/34* (2013.01); *H01F 41/02* (2013.01); *H03H 1/00* (2013.01); *H03H 3/00* (2013.01); *H01F 2027/2809* (2013.01); *H03H 2001/0085* (2013.01); *H03H 2001/0092* (2013.01)

(58) Field of Classification Search
  USPC .................................................. 336/200, 232
  See application file for complete search history.

(56) References Cited

U.S. PATENT DOCUMENTS

| | | | |
|---|---|---|---|
| 2012/0099231 A1* | 4/2012 | Ishihara | ............. C08G 18/0823 361/56 |
| 2014/0313633 A1* | 10/2014 | Fujimori | .................. H01T 4/12 361/220 |
| 2015/0036248 A1* | 2/2015 | Umeda | .................. H02H 9/044 361/56 |
| 2016/0028227 A1 | 1/2016 | Suzuki et al. | |
| 2016/0351327 A1 | 12/2016 | Shigematsu | |
| 2017/0033097 A1 | 2/2017 | Sumi et al. | |

FOREIGN PATENT DOCUMENTS

| | | | |
|---|---|---|---|
| JP | 2012-033976 A | 2/2012 | |
| JP | 2013-101911 A | 5/2013 | |
| JP | 2016-042436 A | 3/2016 | |
| KR | 20140059860 A | 5/2014 | |
| KR | 20150115912 A | 10/2015 | |
| WO | 2010/061519 A1 | 4/2012 | |
| WO | WO-2015190404 A1 * | 12/2015 | ............... H01T 4/10 |
| WO | 2015/190404 A1 | 4/2017 | |
| WO | 2016/080108 A1 | 4/2017 | |

OTHER PUBLICATIONS

Notice of Office Action issued in corresponding Korean Application No. 10-2016-0079554, dated Jul. 20, 2017.

* cited by examiner

COMPLEX ELECTRONIC COMPONENT AND METHOD FOR MANUFACTURING THE SAME

CROSS-REFERENCE TO RELATED APPLICATION(S)

This application claims the benefit of priority to Korean Patent Application No. 10-2016-0079554, filed on Jun. 24, 2016 in the Korean Intellectual Property Office, the entire disclosure of which is incorporated herein by reference.

TECHNICAL FIELD

The present disclosure relates to a complex electronic component and a method for manufacturing the same, and, more particularly, to a complex electronic component having excellent durability against an electrostatic discharge (ESD), and a method for manufacturing the same.

BACKGROUND

The trend of using a case formed of a metal material having conductivity in a portable electronic device has recently increased. Accordingly, there is an increased need to prevent users from experiencing electrical shock, generated in the interior and passed to the exterior of the electronic device.

In particular, the case in which a front surface of the portable electronic device has been manufactured using a metal frame has increased, both to improve the device's aesthetic impression and its hardness. Hence, the need to protect internal electronic components from an external electrostatic discharge (ESD) or to prevent electric shocks to users, due to the internal power of the device, has increased further.

However, due to the miniaturization and integration of the portable electronic device, it has been difficult to create a separate ESD protection element or an electric shock protection element.

SUMMARY

An aspect of the present disclosure may provide a complex electronic component having an ESD protection part having excellent durability against static electricity or an overvoltage.

An aspect of the present disclosure may also provide a method for manufacturing a complex electronic component having an ESD protection part and providing excellent durability against static electricity or an overvoltage.

According to an aspect of the present disclosure, the complex electronic component may include: an element part and an electrostatic discharge (ESD) protection part disposed on the element part. The ESD protection part includes: first and second discharging electrodes having a gap disposed therebetween; a blocking layer disposed between the first and second discharging electrodes; and a discharging layer which is disposed to cover an upper portion of the blocking layer and is in contact with top surfaces of the first and second discharging electrodes.

According to another aspect of the present disclosure, a method for manufacturing a complex electronic component includes steps of: preparing an element part; forming first and second discharging electrodes on the element part while having a gap therebetween; forming a blocking layer in the gap; and forming a discharging layer to traverse the blocking layer from a portion of a top surface of the first discharging electrode and to cover a portion of atop surface of the second discharging electrode.

BRIEF DESCRIPTION OF THE DRAWINGS

The above and other aspects, features and other advantages of the present disclosure will be more clearly understood from the following detailed description when taken in conjunction with the accompanying drawings, in which.

DETAILED DESCRIPTION

Hereinafter, exemplary embodiments of the present disclosure will be described in detail with reference to the accompanying drawings.

An element part of a complex electronic component according to the present disclosure may be a common mode filter, a capacitor, an inductor, or a thermistor, but is not limited thereto.

However, for clarity of a description of the present disclosure, the common mode filter will be described by way of example.

Composite Electronic Component

Figure 1:
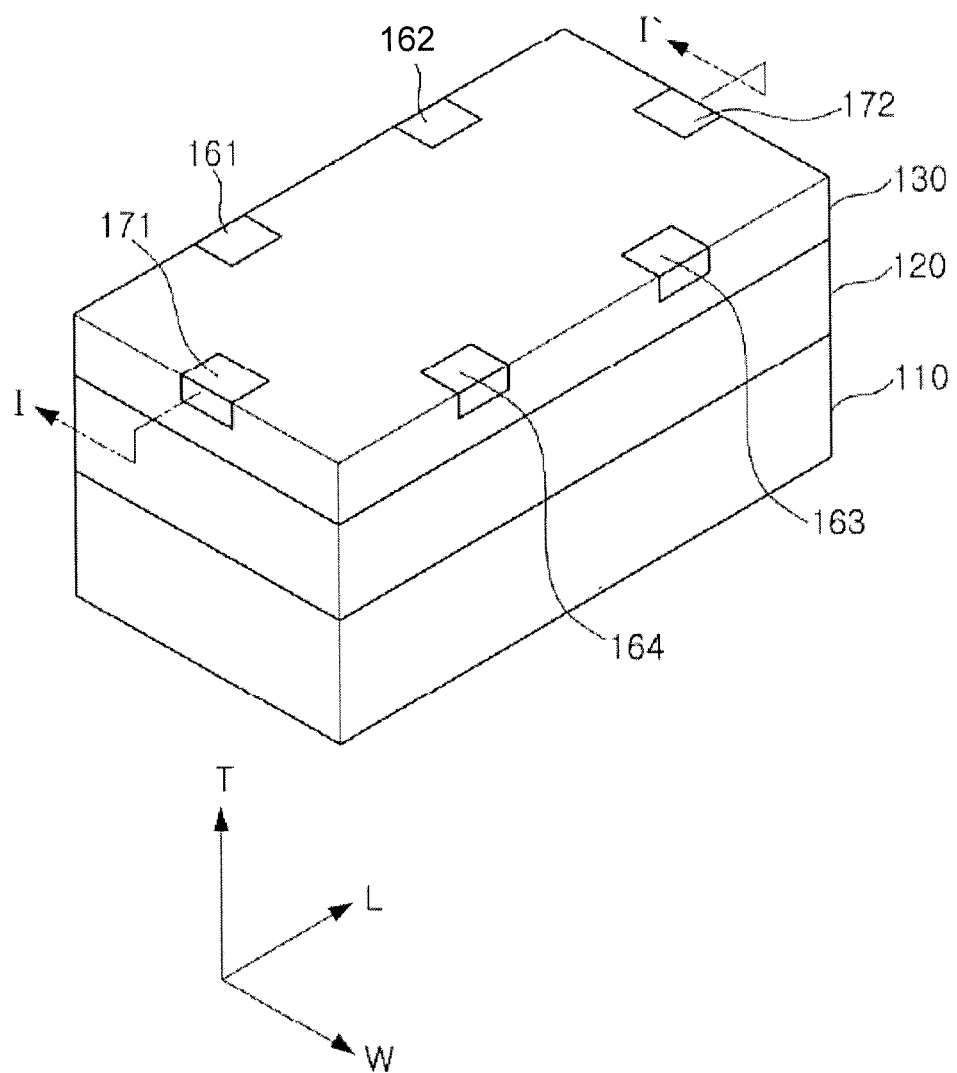
FIG. 1 schematically illustrates a perspective view of a complex electronic component according to an exemplary embodiment in the present disclosure.
Figure 2:
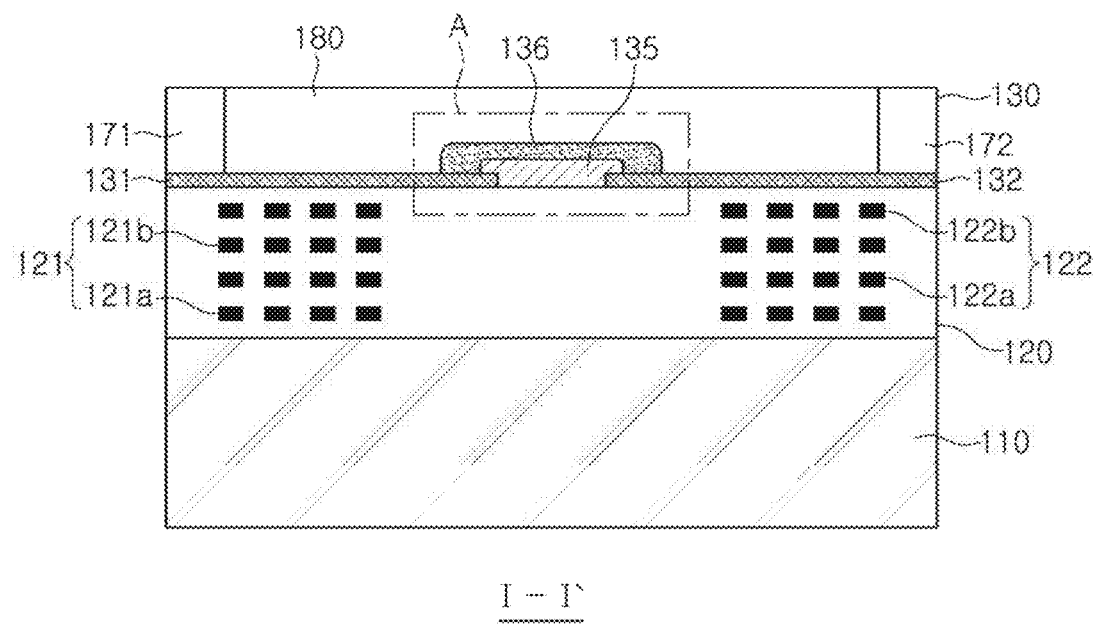
FIG. 2 schematically illustrates a cross-sectional view taken along the line I-I' of FIG. 1.

FIG. 1 schematically illustrates a perspective view of a complex electronic component according to an exemplary embodiment in the present disclosure and FIG. 2 schematically illustrates a cross-sectional view taken along the line I-I' of FIG. 1.

Hereinafter, a structure of the complex electronic component according to an exemplary embodiment will be described with reference to FIGS. 1 and 2.

The complex electronic component according to an exemplary embodiment may include an element part having a substrate 110 and a filter part 120, and an ESD protection part 130.

First, a structure of the element part will be described. In a case in which the element part is the common mode filter, the filter part 120 disposed on the substrate 110 may include a first coil 121 and a second coil 122.

The substrate 110 may include a magnetic material, and may be, for example, a ferrite substrate.

The filter part 120 may be disposed on the substrate 110.

The filter part 120 may include the first coil 121 and the second coil 122.

The first coil 121 may be formed by connecting a 1-1-coil 121a and a 1-2-th coil 121b to each other through a conductive via, and the second coil 122 may be formed by connecting a 2-1-th coil 122*a* and a 2-2-th coil 122*b* to each other through the conductive via.

That is, first and third external electrodes 161 and 163 may be electrically connected to the first coil 121, and second and fourth external electrodes 162 and 164 may be electrically connected to the second coil 122.

The complex electronic component may have inductance and capacitance provided by the respective coils, connected as described above, and noise of a common mode signal may be attenuated using the inductance and capacitance provided thereby.

In a case in which a current temporarily flows into the common mode filter, due to an overvoltage or static electricity, the common mode filter may be destroyed or damaged. Therefore, an apparatus or a configuration capable of preventing the above-mentioned problem may be provided.

Since the complex electronic component, according to an exemplary embodiment, has the ESD protection part disposed on the element part, it has high durability against the current caused by overvoltage or the static electricity, whereby reliability of the complex electronic component may be improved.

The ESD protection part 130 may be disposed on the element part, that is, on the filter part 120.

The ESD protection part 130 may include first and second discharging electrodes 131 and 132 on the filter part 120 formed using a conductive paste. For example, the first and second discharging electrodes 131 and 132 may be disposed on the same plane while having a gap therebetween, but are not limited thereto. The first and second discharging electrodes 131 and 132 may be electrically connected to the first and second external electrodes 171 and 172 for the ESD protection part, respectively. The first and second discharging electrodes 131 and 132 may have thicknesses of 12 μm to 18 μm.

The blocking layer 135 may be disposed between the first and second discharging electrodes 131 and 132.

Figure 3:
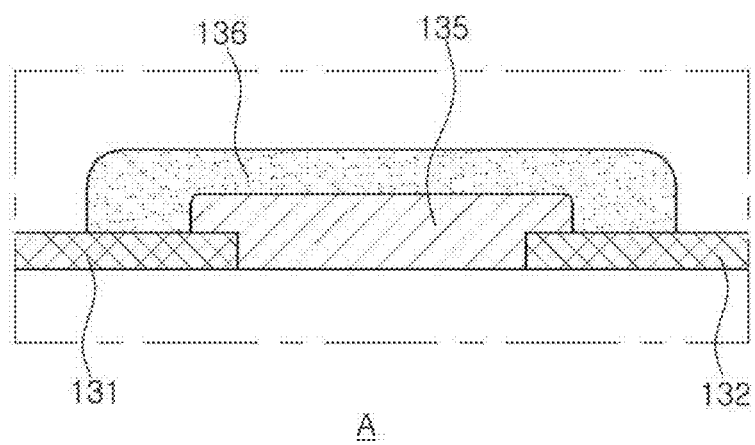
FIG. 3 is an enlarged cross-sectional view of a region A of FIG. 2.

Referring to FIG. 3, the blocking layer 135 may be disposed to cover end portions of the first and second discharging electrodes 131 and 132. As described below, since the blocking layer 135 covers the end portions of the first and second discharging electrodes 131 and 132, a phenomenon in which an electric field is focused on corners of the end portions of the first and second discharging electrodes 131 and 132 is prevented, improving durability and reliability of the complex electronic component even in a case in which an overvoltage current or static electricity flows through the first and second discharging electrodes 131 and 132 and a discharging layer 136.

In addition, the discharging layer 136 may be disposed to traverse the blocking layer 135 from a portion of a top surface of the first discharging electrode 131 and to cover a portion of a top surface of the second discharging electrode 132.

The discharging layer 136, which is a composite of a conductive metal powder and a resin, is operated as an insulator at a predetermined voltage or less, but has a path provided by the conductive metal powder, in which the current may flow in a case in which overvoltage or static electricity occurs, to thereby serve to prevent the overvoltage or static electricity from flowing into the element part.

In an ESD protection part, according to the related art, the discharging layer including the conductive metal powder in an epoxy resin was formed between the first and second discharging electrodes. The discharging layer may be operated ordinarily as an insulating layer, but may provide a path in which the current may flow in the case in which overvoltage or static electricity occurs.

Figure 4:
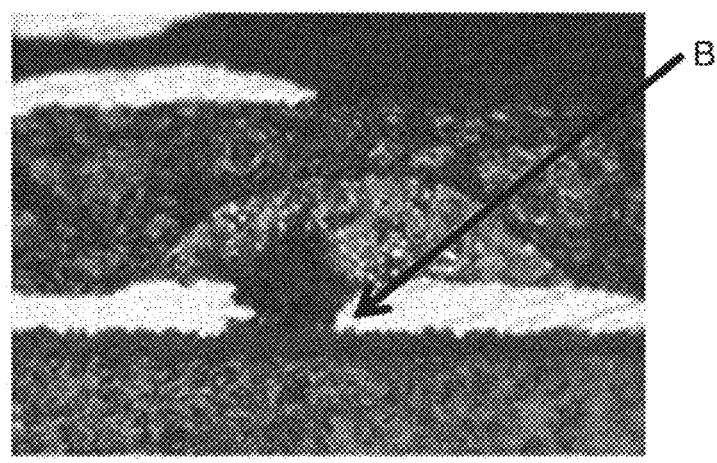
FIG. 4 is a photograph obtained by photographing a degradation and destruction phenomenon of the closest region of a structure of first and second discharging electrodes in a case in which a blocking layer is not formed between the first and second discharging electrodes.

However, as seen from a black portion indicated by an arrow B of FIG. 4, a degradation and destruction phenomenon due to overvoltage or static electricity was observed at the point where the first and second discharging electrodes are closest to each other. In particular, such a degradation phenomenon is a problem in that it causes carbonization on a surface of the epoxy resin to thereby form a carbonization conductive path, thereby decreasing voltage withstand characteristics.

The ESD protection part 130 of the complex electronic component according to an exemplary embodiment has the blocking layer 135 disposed between the first and second discharging electrodes 131 and 132, to block a horizontal current flow between the first and second discharging electrodes 131 and 132, whereby durability and reliability of the complex electronic component may be improved.

In addition, according to the related art, in a case in which the discharging layer is disposed in a gap between the first and second discharging electrodes, the discharging electrode may have a contact area only equal to the thicknesses of the first and second discharging electrodes. Further, even in the case in which the discharging layer is formed to cover the end portions of the first and second discharging electrodes, the overvoltage or the static electricity flows into the point where the first and second discharging electrodes are closest to each other due to the fact that current flows into a portion having the lowest resistance. As a result, the degradation and destruction phenomenon has occurred.

However, since the complex electronic component according to an exemplary embodiment has the blocking layer 135 disposed between the first and second discharging electrodes 131 and 132, and the discharging layer 136 disposed to cover the blocking layer 135, while being in contact with the top surfaces of the first and second discharging electrodes, the distance that the first and second discharging electrodes 131 and 132 and the discharging layer 136 are in contact with each other may be formed to be greater than the thicknesses of the first and second discharging electrodes, to thereby increase areas where the first and second discharging electrodes 131 and 132 and the discharging layer 136 are in contact with each other, so that durability and reliability of the complex electronic component may be improved.

In addition, the blocking layer 135 allows a path of the current flowing through the discharging layer 136 to be long, whereby durability and reliability of the complex electronic component may also be improved.

In particular, since the blocking layer 135 covers the end portions of the first and second discharging electrodes 131 and 132, a phenomenon in which an electric field is focused on corners of the end portions of the first and second discharging electrodes 131 and 132 is prevented, even in a case in which an overvoltage current or static electricity flows through the first and second discharging electrodes 131 and 132 and the discharging layer 136, whereby durability and reliability of the complex electronic component may be further improved.

The blocking layer 135 may include a silicon resin and an insulation ceramic as a filling material. As the insulation ceramic, $SiO_2$ may be used. In a case in which the blocking layer 135 does not include the insulation ceramic such as $SiO_2$, there is a problem that coating property may be significantly decreased. In addition, in the case in which the blocking layer 135 does not include the insulation ceramic such as $SiO_2$, since a thickness of the blocking layer 135 is decreased, the path of the current flowing through the discharging layer 136 is shortened, whereby a voltage withstand destruction phenomenon may occur. Therefore, in order to maintain mechanical strength or a shape of the blocking layer 135, the blocking layer 135 may need to include filling material which is a solid.

Figure 5:
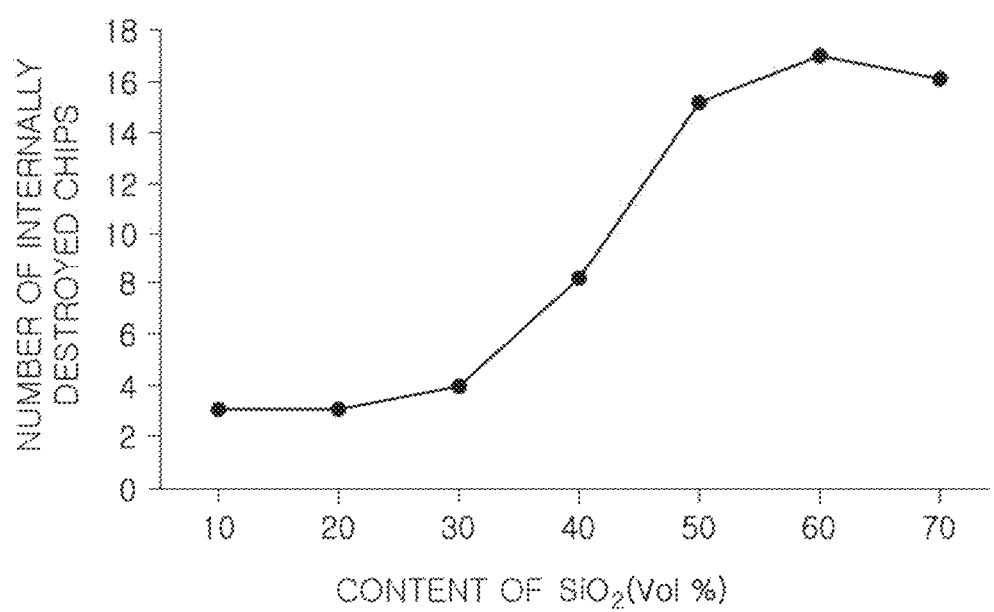
FIG. 5 is a graph illustrating a number of internally destroyed chips according to a content of $SiO_2$ of the blocking layer.

FIG. 5 is a graph illustrating the number of internally destroyed chips according to a content of $SiO_2$, which is the filling material of the blocking layer 135. Referring to FIG. 5, in a case in which the content of $SiO_2$ exceeds 40 vol %, based on a total volume of the blocking layer 135, it may be seen that the number of internally destroyed chips is rapidly increased. That is, in the case in which the content of $SiO_2$ exceeds 40 vol %, based on a total volume of the blocking layer 135, an internal destruction phenomenon of the blocking layer may be rapidly increased due to an increase of interfaces between heterogeneous materials, an increase of internal voids, an increase of foreign materials on a surface of the filling material, and a difference of elasticity between the resin and the filling material.

Therefore, in order to maintain the mechanical strength or shape of the blocking layer 135, $SiO_2$ may be added, but may be included at 40 vol % or less, based on a total volume of the blocking layer 135, whereby durability and reliability of the complex electronic component may be improved.

Method for Manufacturing Complex Electronic Component

Figure 6:
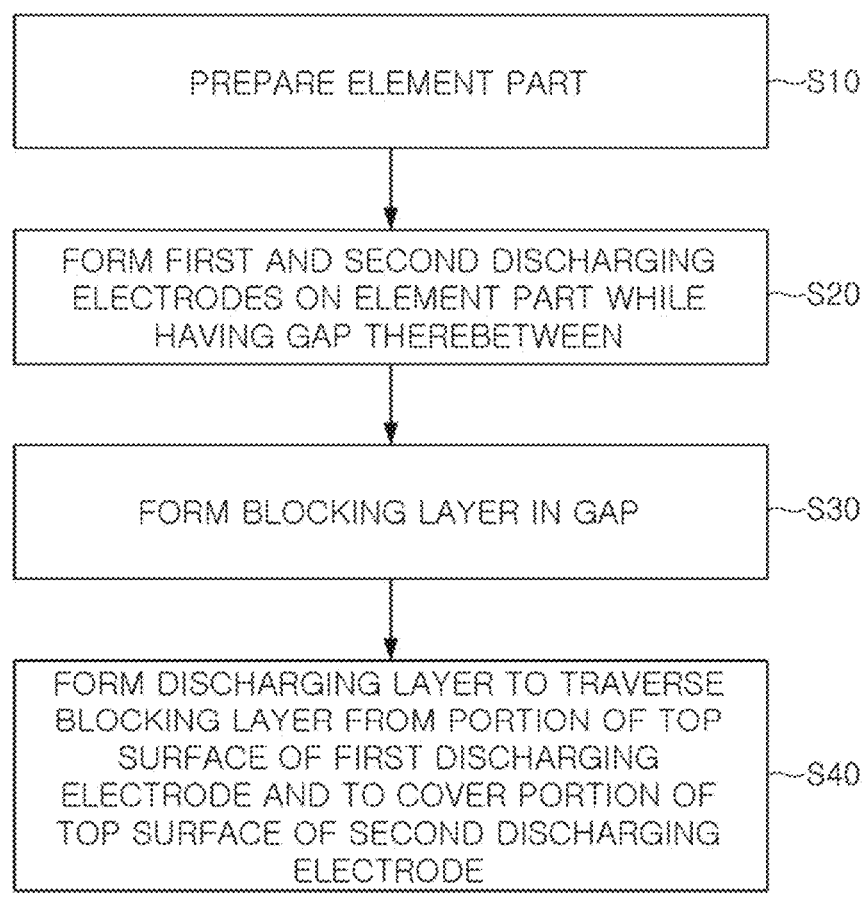
FIG. 6 schematically illustrates a flowchart of a method for manufacturing a complex electronic component according to another exemplary embodiment in the present disclosure.

FIG. 6 presents a flowchart that schematically illustrates a method for manufacturing a complex electronic component according to another exemplary embodiment in the present disclosure.

Referring to FIG. 6, a method for manufacturing a complex electronic component according to another exemplary embodiment may include an operation (S10) of preparing an element part, an operation (S20) of forming first and second discharging electrodes on the element part while having a gap therebetween, an operation (S30) of forming a blocking layer in the gap, and an operation (S40) of forming a discharging layer to traverse the blocking layer from a portion of a top surface of the first discharging electrode and to cover a portion of a top surface of the second discharging electrode.

First, the operation (S10) of preparing the element part may be performed. The operation (S10) of preparing the element part may generally be performed using a method for manufacturing a common mode filter. However, the operation (S10) of preparing the element part does not mean preparing a perfectly completed element, but means that a basic operation in which the element part may be operated as an element is completed.

Next, the operation (S20) of forming the first and second discharging electrodes on the element part may be performed. The operation (S20) of forming the first and second discharging electrodes may be performed by printing a conductive paste, but is not limited thereto. In the operation (S20) of forming the first and second discharging electrodes, the gap may be formed between the first and second discharging electrodes. According to the related art, durability against overvoltage or static electricity may be improved by precisely forming the gap between the first and second discharging electrodes, but since the complex electronic component according to the present disclosure has the blocking layer formed between the first and second discharging electrodes as described below, the gap may not be precisely formed, as compared to the related art.

After the forming of the first and second discharging electrodes, the operation (S30) of forming the blocking layer in the gap between the first and second discharging electrodes may be performed. The blocking layer 135 may include a silicon resin and $SiO_2$ as a filling material. In a case in which the blocking layer 135 does not include a solid such as $SiO_2$, a coating property may be significantly decreased. In addition, in the case in which the blocking layer 135 does not include the solid such as $SiO_2$, since a thickness of the blocking layer 135 is decreased, a path of a current flowing through a discharging layer to be described below is shortened, whereby a voltage withstand destruction phenomenon may occur. Therefore, in order to maintain the mechanical strength or shape of the blocking layer, the blocking layer may need to include the filling material, which is a solid.

However, in a case in which a content of $SiO_2$ exceeds 40 vol %, based on a total volume of the blocking layer, the number of internally destroyed chips may be rapidly increased. That is, in the case in which the content of $SiO_2$ exceeds 40 vol %, an internal destruction phenomenon of the blocking layer may be rapidly increased due to an increase of interfaces between heterogeneous materials, an increase of internal voids, an increase of foreign materials on a surface of the filling material, and a difference of elasticity between the resin and the filling material.

Therefore, in order to maintain the mechanical strength or shape of the blocking layer, $SiO_2$ may be added, but may be included at 40 vol % or less, whereby durability and reliability of the complex electronic component may be improved.

Next, the operation (S40) of forming the discharging layer to traverse the blocking layer from a portion of a top surface of the first discharging electrode and to cover a portion of a top surface of the second discharging electrode may be performed. The discharging layer may be a mixed composite of a conductive powder and an epoxy resin.

When the discharging layer is formed, areas of the discharging layer, which is in contact with the top surfaces of the first and second discharging electrodes, are increased, whereby the degradation of the epoxy resin of the discharging layer due to the overvoltage or the static electricity may be prevented. For example, the areas where the first and second discharging electrodes and the discharging layer are in contact with each other may be formed to be greater than areas of the end portions of the first and second discharging electrodes in a length direction of the first and second discharging electrodes.

As set forth above, according to the exemplary embodiments in the present disclosure, the complex electronic component has a blocking layer disposed between the first and second discharging electrodes of the ESD protection part to block the horizontal current flow and to prevent a degradation and destruction phenomenon of the region where the first and second discharging electrodes are closest to each other, whereby reliability of the complex electronic component may be improved.

While exemplary embodiments have been shown and described above, it will be apparent to those skilled in the art that modifications and variations could be made without departing from the scope of the present invention, as defined by the appended claims.

What is claimed is:
1. A complex electronic component comprising:
an element part and an electrostatic discharge (ESD) protection part disposed on the element part,
wherein the ESD protection part includes:
first and second discharging electrodes having a gap disposed therebetween;

a blocking layer arranged in a portion of the gap between the first and second discharging electrodes; and a discharging layer which is disposed to cover an upper portion of the blocking layer and is in contact with respective top surfaces of the first and second discharging electrodes in a stacking direction of the complex electronic component, wherein the blocking layer includes a reduced-thickness portion extending onto the respective top surfaces of the first and second discharging electrodes, and wherein the reduced-thickness portion is disposed on a different level from the first and second discharging electrodes in the stacking direction, and is in direct contact with a portion of the discharging layer.

2. The complex electronic component of claim 1, wherein the blocking layer is disposed to cover end portions of the first and second discharging electrodes.

3. The complex electronic component of claim 1, wherein the blocking layer includes an insulation ceramic and a silicon resin.

4. The complex electronic component of claim 3, wherein a content of the insulation ceramic is less than 40 vol %, based on a total volume of the blocking layer.

5. The complex electronic component of claim 3, wherein the insulation ceramic is $SiO_2$.

6. The complex electronic component of claim 5, wherein a content of the $SiO_2$ is less than 40 vol %, based on a total volume of the blocking layer.

7. The complex electronic component of claim 1, wherein the element part is a common mode filter.

* * * * *